(12) United States Patent
Lee

(10) Patent No.: US 7,363,185 B2
(45) Date of Patent: Apr. 22, 2008

(54) FLUXGATE SENSOR FOR CALIBRATING AZIMUTH AT SLOPE AND CALIBRATION METHOD THEREOF

(75) Inventor: Woo-jong Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 449 days.

(21) Appl. No.: 10/974,740

(22) Filed: Oct. 28, 2004

(65) Prior Publication Data

US 2005/0114076 A1    May 26, 2005

(30) Foreign Application Priority Data

Nov. 11, 2003    (KR) .................. 10-2003-0079312

(51) Int. Cl.
*G01R 33/04*    (2006.01)
(52) U.S. Cl. .................. 702/104; 324/253; 29/606
(58) Field of Classification Search .................. 702/104
See application file for complete search history.

(56) References Cited

U.S. PATENT DOCUMENTS 5,812,992 A * 9/1998 de Vries .................. 706/25
6,813,584 B2 * 11/2004 Zhou et al. .................. 702/151
2004/0027121 A1 * 2/2004 Choi et al. .................. 324/253

FOREIGN PATENT DOCUMENTS

JP    09-325029    12/1997

* cited by examiner

*Primary Examiner*—John Barlow
*Assistant Examiner*—Sujoy Kundu
(74) *Attorney, Agent, or Firm*—Sughrue Mion, PLLC

(57) ABSTRACT

A two-axis fluxgate sensor has a driving pulse generating circuit which generates pulse signal and outputs as a driving signal, and X-axis and Y-axis fluxgates which are in proportional relation with each other. The two-axis fluxgate sensor generates voltage values of X-axis and Y-axis fluxgates corresponding to the magnetism which is generated from the driving signal, and a memory stores therein a neural network weight matrix. When the voltage values of the X-axis and Y-axis fluxgates are measured, a control unit compensates for the voltage values by using the neural network weight matrix which is stored in the memory, and computes an azimuth angle by using the compensated voltage values. An accurate azimuth angle can be obtained even at slopes.

10 Claims, 8 Drawing Sheets

FIG. 5

| PITCH ANGLE | : 30° | ROLL ANGLE | : 0° | | |
|---|---|---|---|---|---|

| YAW (ψ) | PITCH ANGLE | : 30° | ROLL ANGLE | : -5° | |
|---|---|---|---|---|---|
| 0 | | | | | |
| 5 | | | | | |
| 10 | YAW (ψ) | PITCH ANGLE : 30° | | ROLL ANGLE : -10° | |
| 15 | 0 | | | | |
| 20 | 5 | YAW ANGLE (ψ) | YAW ANGLE (rad) | X-AXIS OUTPUT VALUE | Y-AXIS OUTPUT VALUE | cos ψ | sin ψ |
| | 10 | 0 | 0.000 | 0.09 | -0.18 | 1.000 | 0.000 |
| | 15 | 5 | 0.087 | 0.08 | -0.13 | 0.996 | 0.087 |
| | 20 | 10 | 0.175 | 0.08 | -0.08 | 0.985 | 0.174 |
| | | 15 | 0.262 | 0.07 | -0.03 | 0.966 | 0.259 |
| | | 20 | 0.349 | 0.05 | 0.02 | 0.940 | 0.342 |
| ⋮ | ⋮ | ⋮ | ⋮ | ⋮ | ⋮ | ⋮ | ⋮ |
| 345 | | | | | | | |
| 350 | 345 | | | | | | |
| 355 | 350 | 345 | 6.021 | 0.07 | -0.33 | 0.966 | -0.259 |
| | 355 | 350 | 6.109 | 0.08 | -0.28 | 0.985 | -0.174 |
| | | 355 | 6.196 | 0.09 | -0.23 | 0.996 | -0.087 |

FLUXGATE SENSOR FOR CALIBRATING AZIMUTH AT SLOPE AND CALIBRATION METHOD THEREOF

This application claims the benefit of Korean Patent Application No. 2003-79312 filed Nov. 11, 2003, in the Korean Intellectual Property Office, the disclosure of which is incorporated herein by reference.

BACKGROUND OF THE INVENTION

1. Field of the Invention

The present invention relates to a fluxgate sensor for measuring an azimuth angle and a method thereof, and more particularly, to a fluxgate sensor which is capable of obtaining calibrated azimuth even at slope by using a neural network, and an azimuth measurement method thereof.

2. Description of the Related Art

A fluxgate sensor operates to measure intensity and orientation of terrestrial magnetism, which are unperceivable by human sensory systems. More specifically, a fluxgate sensor uses a fluxgate to detect terrestrial magnetism. The fluxgate sensors can find the accurate orientation of a place of detection based on the detected terrestrial magnetism, and are widely used in many applications such as navigation devices in automobiles, and map services for mobile phones and portable terminals.

The fluxgate sensor detects the size and orientation of an external magnetic field by applying an excitation magnetic field to a high permeability magnetic material such as permalloy through a driving coil, and measuring a secondary frequency harmonic, which is in proportional relation with the external magnetic field, by using the magnetic saturation of the magnetic core and nonlinear magnetic characteristics.

Fluxgate sensors were first introduced in late 1930. Fluxgate sensors provide more advantages than other types of terrestrial magnetic sensors, such as higher sensitivity, cheaper price and compactness. Furthermore, the fluxgate sensors consume less power than other sensors, and also have long-term stability. As a result, fluxgate sensors have been applied in a variety of areas for both commercial and military use, which include detection of weak magnetic field, absolute terrestrial directions, exploration for vein of ore, target search, positioning of an artificial satellite, and space exploration. Fluxgate sensors are continuously researched for better performance.

Recently, as the micro electro mechanical system (MEMS) technology is introduced, many efforts have been made to develop a micro-sized fluxgate sensor with low power consumption. If developed, this new type of fluxgate sensors will further enhance performance of the terminal devices such as portable telephones. However, considering that the portable devices are carried around by users, the compactness of the fluxgate sensor must be guaranteed and this compromises the stable detection. The portable device faces almost every direction as the user holds it in hand and moves around, and further, the portable device changes directions almost constantly. This means that the fluxgate sensor implemented in the portable device is subject to countless direction changes to any slope angle, and accordingly, a method is required to protect the fluxgate sensor from the influence of sloping by real-time basis, and automatically compensate for the signal detected therefrom.

FIG. 1 is a block diagram of a conventional fluxgate sensor. Referring to FIG. 1, the fluxgate sensor 100 has a driving pulse generating circuit 101, a coil driving current amplifying circuit 102, a two-axis fluxgate 103, a chopping circuit 104, a primary amplifying circuit 105, a low-frequency filter 106, a secondary amplifying circuit 107, an A/D converter 108, a controller 110, a slope detection device 120, and a memory 130.

The driving pulse generating circuit 101 generates a driving pulse to drive the two-axis fluxgate 103, and selectively switches the driving pulse to apply to the coil driving current amplifying circuit 102. The coil driving current amplifying circuit 102 uses a number of amplifiers and inverters to output a pulse signal and an inverted pulse signal at opposite phase with each other from the pulse outputted from the driving pulse generating circuit 101.

The two-axis fluxgate 103 includes X-axis and Y-axis fluxgates. Accordingly, the two-axis fluxgate 103 is driven by the pulse signal and inverted pulse signal transmitted to the X-axis and Y-axis fluxgates, and outputs a detection signal corresponding to the electromotive force which is generated by the driving thereof. In FIG. 1, two rectangular-ring magnetic cores are placed with their lengths aligned to X and Y axes, respectively, and the driving coil and detection coil are wound around the magnetic cores, respectively. Upon application of the driving pulse through the driving coil, a magnetic field is generated from the X-axis and Y-axis fluxgates, and therefore, the induced electromotive force can be detected through the detection coil.

The electric signal, which is detected from the two-axis fluxgate 103, is chopped at the chopping circuit 104 through proper control on the number of internal switches of the chopping circuit 104. After the chopping, the electric signal is amplified at the primary amplifying circuit 105 by differential amplification, and then a certain range of signals are filtered through the low-frequency filter 106, and finally amplified in the secondary amplifying circuit 107. After the amplification, the signals are converted to digital voltage values through the A/D converter 108 and the outputted.

To represent 3-dimensional space by using X, Y, Z axes, the slope detection device 120 is configured as a two-axis acceleration velocity sensor having an X-axis acceleration velocity sensor placed in x-axis and a Y-axis acceleration velocity sensor placed in y-axis. The slope detection device 120 operates to calculate the pitch and roll angles of the slanted position by using the signals obtained when slanted toward the gravity of the earth. In other words, the slope detection device 120 measures pitch and roll angles by inspecting the movement of a certain weight according to gravity, through the use of visual tools or electric circuits such as a goniometer, a scale or an indicator needle. The measured pitch and roll angles are stored in the memory 130.

When the induced electromotive force, detected at the two-axis fluxgate 103, is processed through a series of processes to be inputted as digital values, the pitch and roll angles stored in the memory, the dip angle in the current position, and the digital value inputs are substituted in a series of equations to calculate an azimuth.

However, according to the conventional way as described above, because pitch and roll angles are measured by using the acceleration of gravity, errors would occur in the pitch and roll angle measurement if current position swiftly changes, and therefore, it is hardly applicable to the movable devices such as portable devices. Additionally, the requirement for slope detection device 120 increases the volume as well as the manufacturing cost of the device, and also, power consumption increases. The conventional approach is quite difficult to apply to the field of portable devices which is now receiving the most attention from many manufacturers.

SUMMARY OF THE INVENTION

The present invention has been developed in order to solve the above drawbacks and other problems associated with the conventional arrangement. An exemplary aspect of the present invention is to provide a fluxgate sensor which is capable of measuring accurate azimuth even at a slope, by using the data learned through a neural network, and a method of measuring azimuth thereof.

The above exemplary aspects and/or other features of the present invention can substantially be achieved by providing a fluxgate sensor comprising: a two-axis fluxgate having an X-axis fluxgate and a Y-axis fluxgate in substantially perpendicular relation with the X-axis fluxgate, the two-axis fluxgate outputting voltage values of the X-axis and Y-axis fluxgates corresponding to a terrestrial magnetism; a memory storing therein a neural network weight matrix which corresponds to the X-axis and Y-axis fluxgate voltage values, respectively; and a control unit for calibrating the X-axis and Y-axis fluxgate voltage values based on the neural network weight matrix stored in the memory, and computing an azimuth angle by using the calibrated voltage values.

The neural network weight matrix is computed by a training of the neural network, in which a predetermined data sheet is applied to a neural network software. The predetermined data sheet records therein the X-axis and Y-axis fluxgate voltage values corresponding to the changes of pitch, roll and yaw angles of the fluxgate sensor. The predetermined data sheet is made by: with the pitch and roll angles of the fluxgate sensor in certain fixed angle, rotating once the fluxgate sensor to vary the yaw angle by a predetermined degree and measuring and storing the X-axis and Y-axis fluxgate voltage values; and repeating the above operation with varying one of the pitch and the roll angles.

According to an exemplary embodiment of the present invention, an azimuth angle measuring method of a fluxgate sensor which comprises an X-axis fluxgate and a Y-axis fluxgate, and a memory, is provided. The azimuth angle measuring method comprises: (a) measuring voltage values of the X-axis and the Y-axis fluxgates corresponding to the changes of pitch, roll and yaw angles of the fluxgate sensor, normalizing the measured X-axis and Y-axis fluxgate voltage values and accordingly making a predetermined data sheet; (b) making a neural network weight matrix by training a neural network based on the predetermined data sheet; (c) storing in the memory the neural network weight matrix; and (d) measuring the normalized voltage values of the current X-axis and Y-axis fluxgates of the fluxgate sensor, and computing an azimuth angle by using the neural network weight matrix.

The step (a) comprises the steps of: (a1) with the pitch and roll angles of the fluxgate sensor fixed at '0' angle, rotating the fluxgate sensor once to vary the yaw angle by a predetermined degree, and measuring and normalizing the voltage values of the X-axis and Y-axis fluxgates; (a2) measuring and storing the maximum, the minimum and the dip angle of the voltage values of the X-axis and Y-axis fluxgates; (a3) with the pitch and roll angles of the fluxgate sensor fixed at a predetermined degree, rotating the fluxgate sensor once to vary the yaw angle by a predetermined degree and measuring the voltage values of the X-axis and Y-axis fluxgates; (a4) computing cos-function value and sin-function value of the yaw angle and recognizing the computed values as a reference value; (a5) varying one of the pitch angle and the roll angle of the fluxgate sensor by a predetermined degree and repeating the steps (a3) and (a4); and (a6) measuring, normalizing and storing the X-axis and Y-axis fluxgate voltage values in every change of one of the pitch angle, the roll angle and the yaw angle and thereby making a data sheet.

The step (b) comprises the steps of: (b1) executing a neural network software; (b2) forward processing of inputting output values of the X-axis and Y-axis fluxgates of the data sheet to the neural network, applying a predetermined weight and outputting as a cos-function value and a sin-function value; (b3) backward processing of obtaining an error value by comparing the cos-function value and the sin-function value with a corresponding reference value recorded in the data sheet, and if the error value is determined to exceed a predetermined allowable range, correcting the weight so that the cos-function value and the sin-function value can be brought close to the reference value; (b4) repeating the steps (b2) and (b3) until the error value falls into the predetermined allowable range; and (b5) when the error value falls into the predetermined allowable range, storing the corresponding weight and thereby making a neural network weight matrix.

The step (d) comprises the steps of: (d1) measuring a normalized value of current X-axis and Y-axis fluxgate voltage values; (d2) computing a cos-function value by applying a corresponding weight of the neural network weight matrix, which is stored in the memory, to an input of the X-axis fluxgate voltage values; (d3) computing a sin-function value by applying a corresponding weight of the neural network weight matrix, which is stored in the memory, to an input of the Y-axis fluxgate voltage values; and (d4) computing an azimuth angle by using the cos-function value and the sin-function value. Because the fluxgate voltage values, including those measured at slopes, can be compensated, accurate measurement of azimuth angle is enabled.

BRIEF DESCRIPTION OF THE DRAWINGS

The above exemplary aspects and features of the present invention will be more apparent by describing certain exemplary embodiments of the present invention with reference to the accompanying drawings, in which:

FIG. 5 is a data sheet listing data measurements obtained with varying the slope of the fluxgate sensor according to an exemplary embodiment of the present invention;

DETAILED DESCRIPTION OF THE PREFERRED EMBODIMENTS

Figure 1:
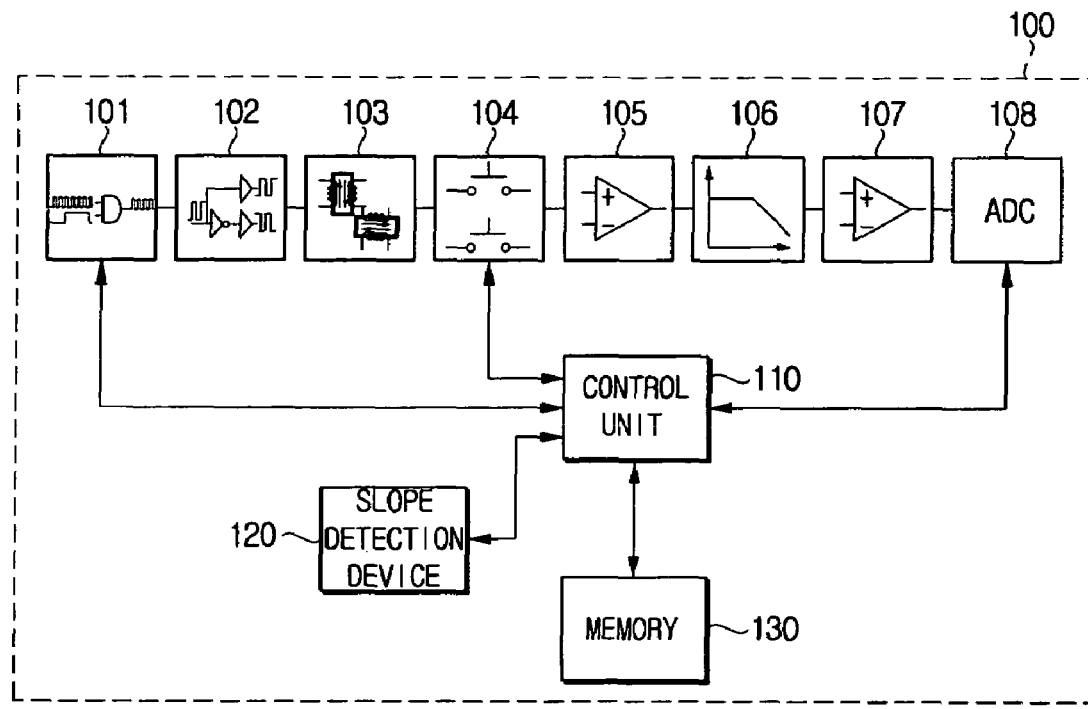
FIG. 1 is a block diagram of a conventional fluxgate sensor having a slope detecting device.

Certain exemplary embodiments of the present invention will be described in greater detail with reference to the accompanying drawings.

In the following description, same drawing reference numerals are used for the same elements throughout the drawings. The matters defined in the description such as detailed construction and elements are only provided to assist in a comprehensive understanding of the invention. Thus, it is apparent that the present invention can be carried out without those defined matters. Also, well-known functions or constructions are not described in detail since they would obscure the invention in unnecessary detail.

Figure 2:
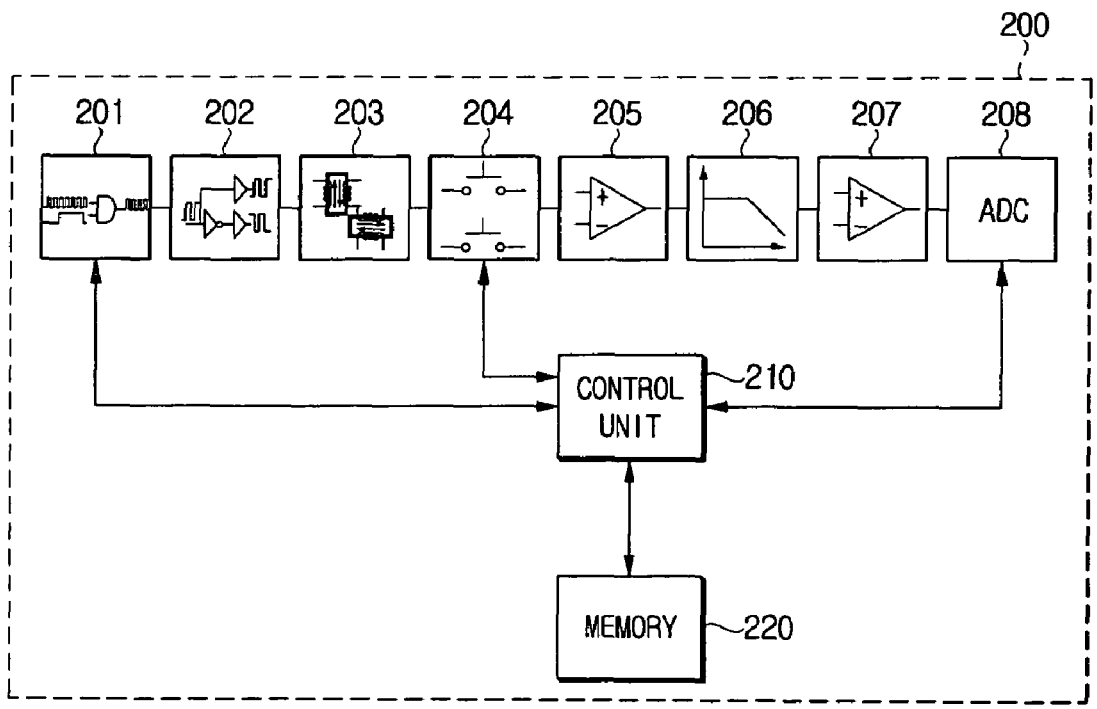
FIG. 2 is a block diagram of a fluxgate sensor according to an exemplary embodiment of the present invention.

FIG. 2 is a block diagram of a fluxgate sensor according to an exemplary embodiment of the present invention. As shown, the fluxgate sensor according to one exemplary embodiment of the present invention is substantially similar in construction to the conventional fluxgate sensor exemplified in FIG. 1. That is, the fluxgate sensor of one exemplary embodiment of the present invention comprises a driving pulse generating circuit 201, a coil driving current amplifying circuit 202, a two-axis fluxgate 203, a chopping circuit 204, a primary amplifying circuit 205, a low-frequency filter 206, a secondary amplifying circuit 207, an A/D converter 208, a control unit 210 and a memory 220.

The above elements of the fluxgate sensor, except for the control unit 210 and the memory 220, are general elements of a two-axis fluxgate sensor and have already been described above. Therefore, description thereof will be omitted for the sake of brevity.

The memory 220 stores therein a neural network weight matrix for use in the fluxgate sensor, and the control unit 210 controls the respective parts of the fluxgate sensor.

When an operator turns on the fluxgate sensor to locate where he/she currently is, the driving pulse generating circuit 201 outputs driving pulses, and the coil driving current amplifying circuit 202 amplifies the driving pulses. The driving signals are then applied to the two-axis fluxgate 202. Accordingly, voltage values of X-axis and Y-axis fluxgates are induced at the two-axis fluxgate 202, and processed through the chopping circuit 204, the primary amplifying circuit 205, the low-frequency filter 206, the secondary amplifying circuit 207 and the A/D converter 208, to be outputted as certain digital values.

The control unit 210 performs neural network forward process, by using an appropriate weight from the neural network weight matrix of the memory 202, which corresponds to the digital voltage value which is outputted from the X-axis and Y-axis fluxgates, and therefore calibrates the X-axis and Y-axis fluxgate voltage values to reference values. Then by computing the current azimuth angle with the calibrated voltage values, current azimuth angle is determined.

Meanwhile, 'neural network' refers to a program or data structure system which is constructed to operate similarly to a human brain. Basic units of a neural network are designed based on a biological neuron model of the neural network of the human brain. Inputs in respective units are combined into a single output through certain combination functions. In this exemplary embodiment, a weighted sum function, which is a very general combination of functions and considers weights, is used to combine the outputs, and an optimum weight is obtained by back-propagation. The optimum weights are recorded in the weight matrix stored in the memory 220. The neural network together with the weight matrix will be described below.

Meanwhile, a weight matrix stored in the memory can be obtained by an appropriate training process, that is, by applying the fluxgate voltage values obtained from the fluxgate sensor 200 at varying slopes to the neural network software. It is advisable that the developer computes the weight matrix and stores it in the developing stage.

A developer places the fluxgate sensor 200 on a jig, and measures outputs from a variety of states by varying the pitch, roll and yaw, normalizes the measured outputs to a data sheet, and therefore, uses the data sheet as input and output references for the neural network.

Figure 3:
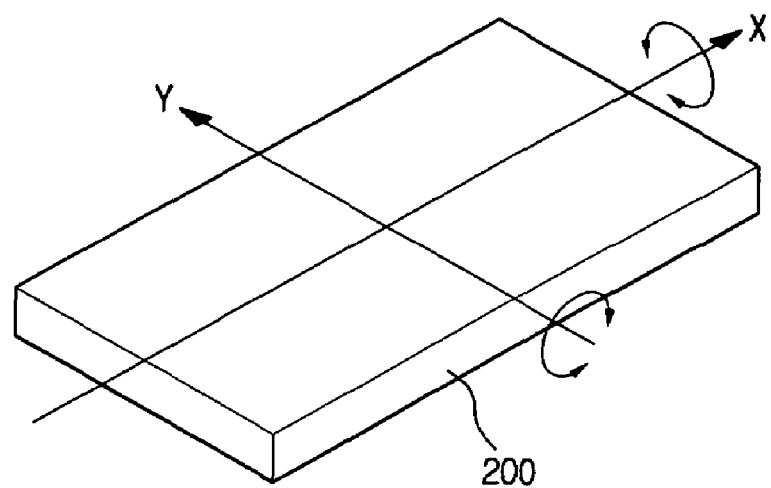
FIGS. 3A and 3B show a fluxgate sensor at a certain slope to measure azimuth angle according to an exemplary embodiment of the present invention.
Figure 3:
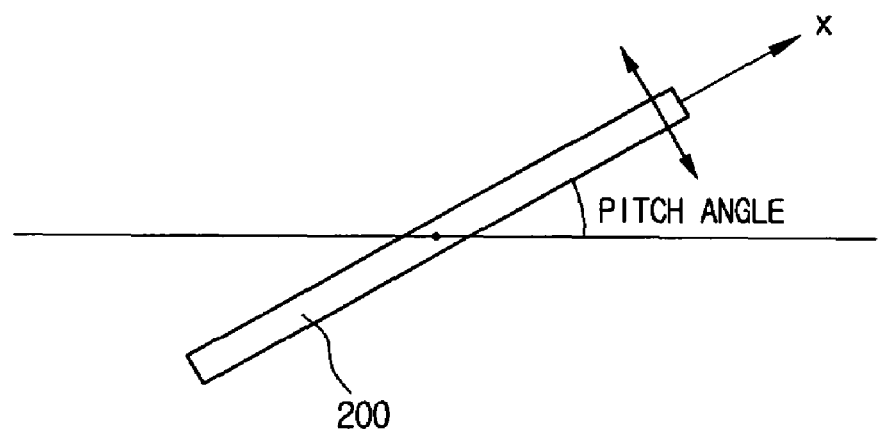
Figure 4:
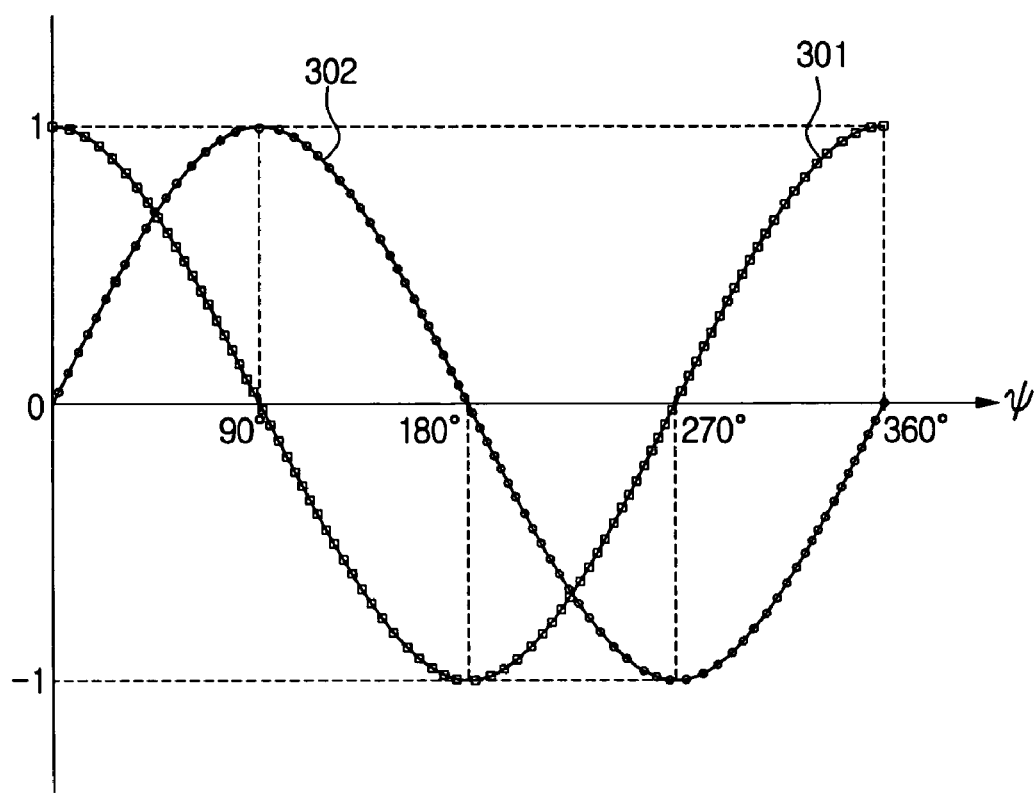
FIG. 4 is a graphical representation showing the voltage values of X-axis and Y-axis fluxgates which are normalized in the fluxgate sensor according to an exemplary embodiment of the present invention.

FIGS. 3A and 3B show the process of varying pitch and roll of the fluxgate sensor 200, and FIG. 4 shows the voltage values of X-axis and Y-axis fluxgates which are normalized to a range of 1~−1.

Referring to FIGS. 3A and 3B, by rotating the fluxgate sensor 200 about the x-axis once, the roll angle changes from 0° to 360°, and by rotating the fluxgate sensor 200 about the y-axis once, the pitch angle changes from 0° to 360°.

Although not shown in the drawings, the fluxgate sensor 200 may be rotated in the z-axis, which is perpendicular to the x-y plane, and in this case, yaw angle changes. The jig is used as a measurement equipment, which mounts a certain device thereon and varies the sloping angle.

FIG. 4 shows the actual digital voltages of the X-axis and Y-axis fluxgates which are normalized. The 'normalization' refers to the process of mapping certain values into a certain range. The normalization can be carried out based on the following equation:

$$Xf_{norm} = \frac{2Xf - Xf_{\max} - Xf_{\min}}{(Xf_{\max} - Xf_{\min})} * \cos\lambda \qquad \text{[Equation 1]}$$

$$Yf_{norm} = \frac{2Yf - Yf_{\max} - Yf_{\min}}{(Yf_{\max} - Yf_{\min})} * \cos\lambda$$

where 'Xf' is an actual voltage value of the X-axis fluxgate, 'Yf' is an actual voltage value of the Y-axis fluxgate, '$Xf_{norm}$' and '$Yf_{norm}$' are normalized values of 'Xf' and 'Yf', '$Xf_{max}$' and '$Xf_{min}$' are maximum and minimum values of 'Xf', '$Yf_{max}$' and '$Yf_{min}$' are maximum and minimum values of 'Yf', and λ is a dip angle. Further, '$Xf_{max}$ and $Xf_{min}$' and '$Yf_{max}$ and $Yf_{min}$' refer to maximum and minimum values which are measured with the pitch and roll angles fixed to 0° (that is, in an equilibrium state) and with yaw angle varying. The outputs from the X-axis and Y-axis fluxgate accordingly have azimuth angles 'cos' and 'sin'. FIG. 4 shows the X-axis fluxgate voltage values represented in the form of cos-function graph 301, and the Y-axis fluxgate voltage values represented in the form of sin-function graph 302.

Meanwhile, a developer of the neural network needs as much data as is sufficient for training of the network. Therefore, the developer is advised to adjust the angle of the jig having the fluxgate sensor 200 thereon at minutely varying degrees, and measure the X-axis and Y-axis fluxgate voltage values to construct a detailed data sheet.

FIG. 5 shows one example of the constructed data sheet. It can be understood from FIG. 5 that the voltage values were measured in every rotation of the fluxgate sensor 200 by 5° of roll angle and with the pitch angle fixed at 30°. First, in the state that the pitch angle is at 30° and the roll angle is at −10°, the fluxgate sensor 200 is rotated with variation of yaw angle ψ by 5° intervals.

Figure 6:
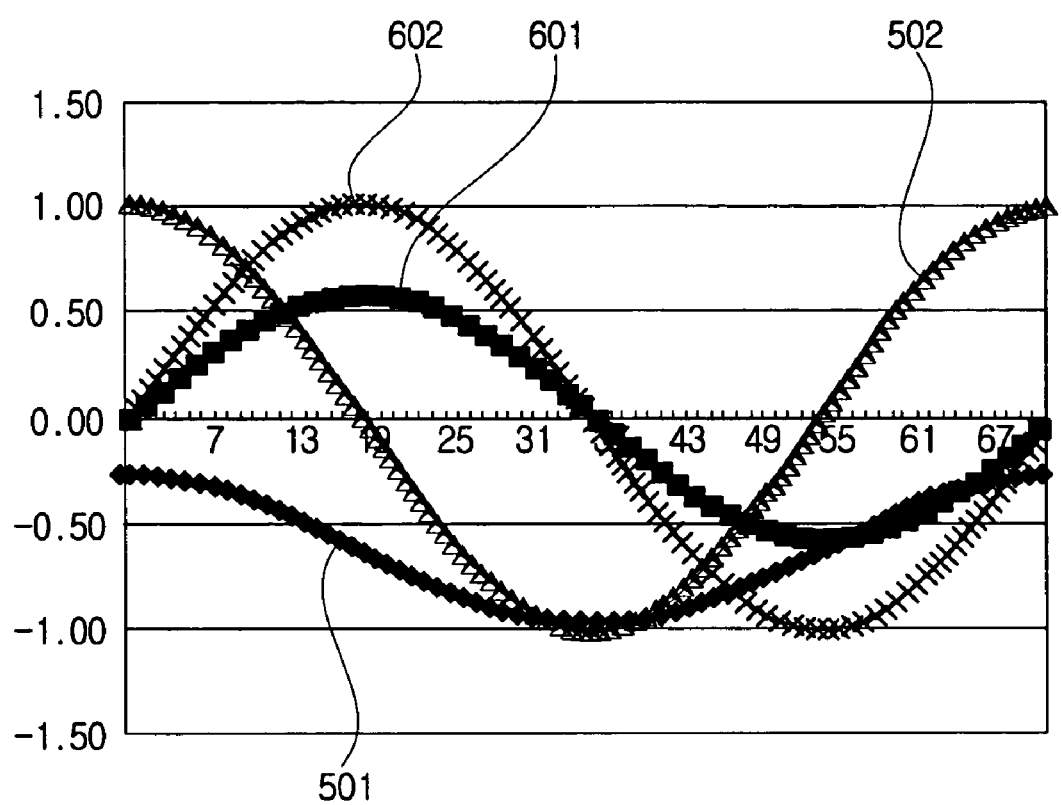
FIG. 6 is a graphical representation of the data sheet of FIG. 5.

The X-axis fluxgate output and Y-axis fluxgate output are measured and recorded in every varying yaw angle, and cos(ψ) and sin(ψ) corresponding to each yaw angle ψ are computed and recorded. The values of cos(ψ) and sin(ψ) can be defined as reference values of the X-axis and Y-axis fluxgates. FIG. 6 shows the graphical representation of the data sheet, illustrating the actual X-axis fluxgate voltage values 501 and Y-axis fluxgate voltage values 601, and reference values 502 and 602.

Figure 7:
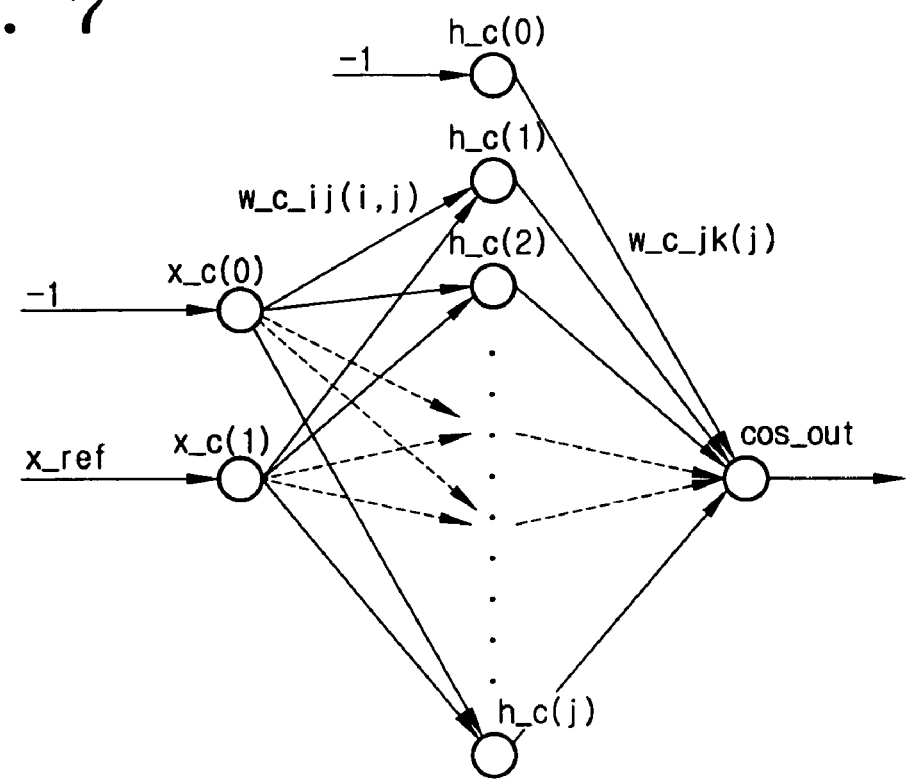
FIG. 7 shows the training of neural network with the voltage values of the X-axis fluxgate.
Figure 8:
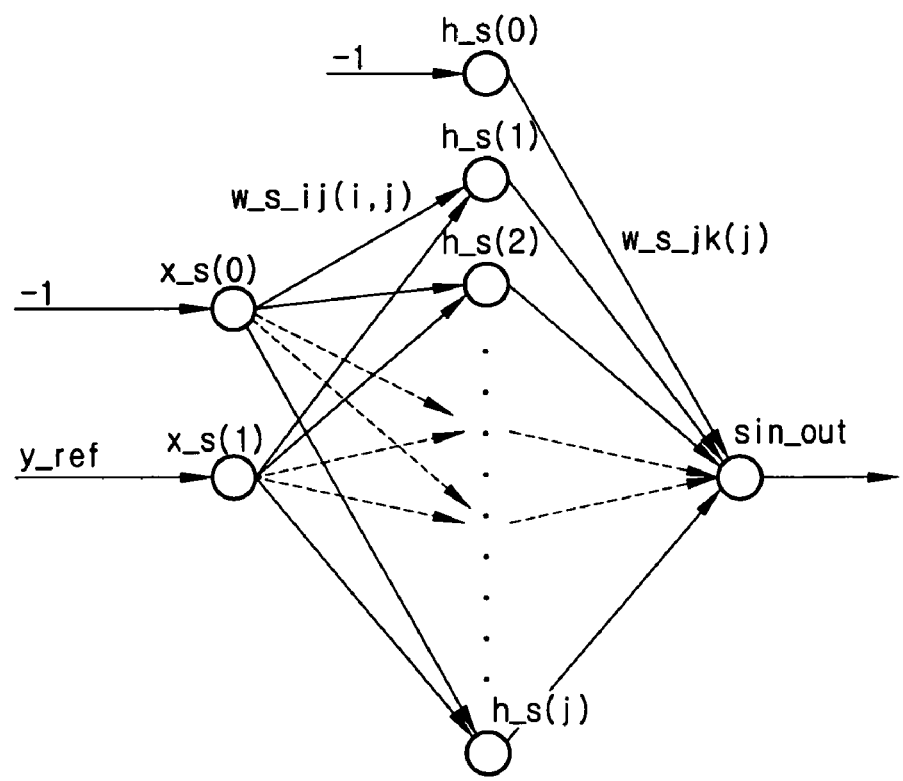
FIG. 8 shows the training of neural network with the voltage values of the Y-axis fluxgate.
Figure 9:
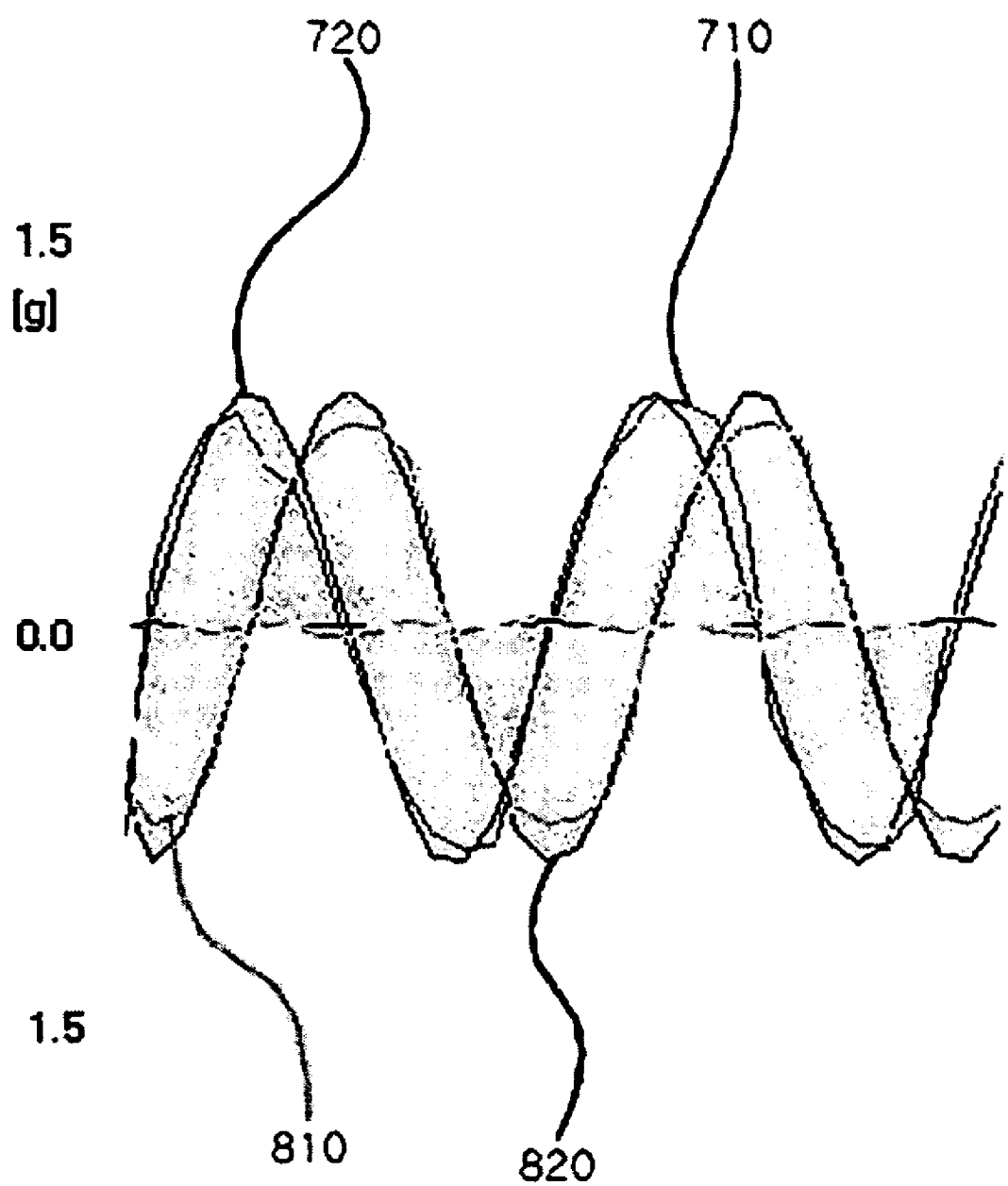
FIG. 9 shows the actual voltage values of X-axis and Y-axis fluxgates being calibrated to reference values by use of matrix of weights of the neural network.

FIGS. 7 and 8 illustrate the concept of neural network training by applying the data sheet of FIG. 5. FIG. 9 shows a graphical representation in which the X-axis and Y-axis fluxgate voltage values are calibrated to reference values by the use of a weight matrix of the learned neural network. This will be described in detail below.

Figure 10:
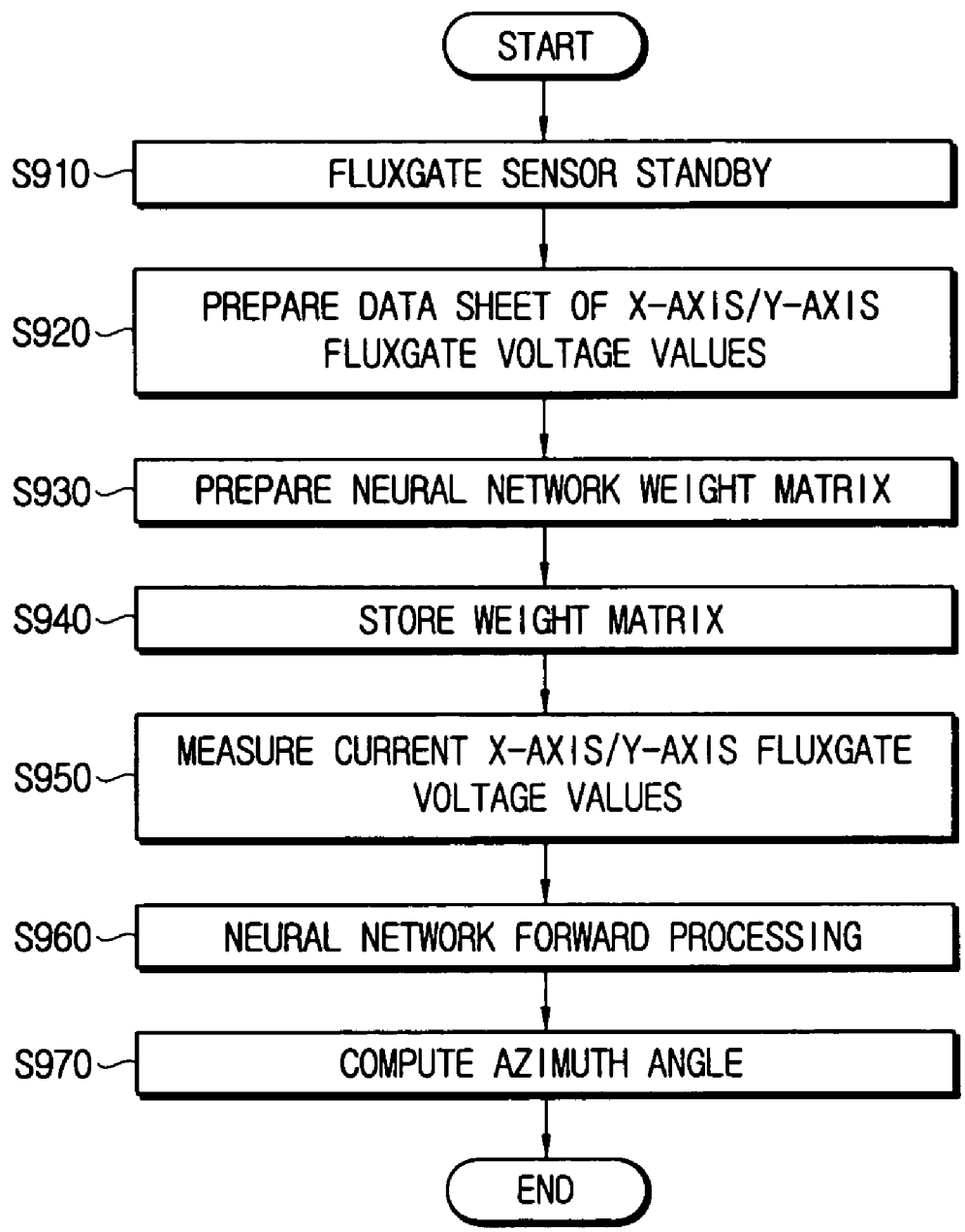
FIG. 10 is a flowchart illustrating a method of measuring an azimuth angle in a fluxgate sensor according to an exemplary embodiment of the present invention.

FIG. 10 shows a flowchart of a method of computing azimuth angle by using the fluxgate sensor 200 according to an exemplary embodiment of the present invention. The fluxgate sensor 200 is rotated from an initial equilibrium, measuring and normalizing maximum and minimum values of the X-axis and Y-axis fluxgate voltage values for the computation of azimuth angle (step S910). The detailed methods and equations for the measurement and normalization have already been described above.

Next, a data sheet is made, with varying the pitch, roll and yaw angles of the fluxgate sensor 200 in order (step S920). Considering that the data of the data sheet become input values and reference values of the neural network, it is advisable that data are recorded as much as possible. FIG. 5 shows one example of the data sheet. As shown, the X-axis and Y-axis fluxgate voltage values are measured with varying the yaw angle by 5° intervals, and then the X-axis and Y-axis fluxgate voltage values are measured with varying the roll angle by 5° intervals. Accordingly, the X-axis and Y-axis fluxgate voltage values are measured with varying the pitch, roll and yaw angles, while cos-function values and sin-function values are obtained with respect to the respective yaw angle and added to the data sheet. The function value become the reference values of the neural network.

Next, a neural network weight matrix is made, by the training of the neural network based on the data sheet (step S930). The training of the neural network is shown in FIGS. 7 and 8.

As described above, a neural network is constructed of basic units which are designed based on the models of neuron activity, and input values in the respective units are combined and output as a single output value through a predetermined combination of functions. According to a weighted summation which takes into consideration and applies weights, inputs of the respective units are multiplied by weights, and summed to an output value. The respective units comprise three layers, that is, input end, hidden node and output end. The input layer, which is at the left-hand side of FIGS. 7 and 8, is where the external values are inputted. The hidden node (or hidden layer) is named as 'hidden' because it is not connected to an input or output of the network. However, the respective units of the hidden node are completely connected to the units of the input layer. Because a network comprises standard units, the respective units of the hidden node can be obtained by multiplying the respective input values by weights. Then an output value is computed by summing the results and then applying the sum to a sigmoid function.

Meanwhile, in order to utilize a neural network, a considerable amount of data or rules related to the data relations have to be supplied beforehand. This process is called 'training' of the neural network. The training of the neural network is the process of applying the most optimum weight to the respective inputs of respective units. This process aims to bring the results of the network to the proximity of a desired output value as close as possible. One of the most general technologies which have been used so far for this process is a backprogagation, which calibrates weights.

The backprogagation computes an output value by using the weights of the network, and then computes an error by comparing a difference between the computed result with an actual result. If the error exceeds a predetermined range, the error is reversely transmitted through the network, and as a result, a weight is adjusted to minimize the error. As the optimum weight is obtained by the above process, the weight is recorded and therefore, a neural network weight matrix is made.

FIG. 7 explains the process of training an X-axis fluxgate voltage value. In FIG. 7, h_c(j) denotes a (j)th hidden node, x_c(i) is an input value of an (i)th input end. Outputs from the respective hidden nodes are summed and outputted as a cos-function value through an output end. Meanwhile, w_c_ij(i, j) denotes a weight between the (i)th input end and (j)th hidden node, and w_c_jk(j, k) refers to a weight between the (j)th hidden node and (k)th output end.

The (j)th hidden node can be obtained by: i) multiplying x_c(i) by a corresponding weight, ii) summing the results of multiplications; and iii) applying a sigmoid function. Herein, a tan-sigmoid function is utilized, and therefore, a hidden node can be obtained by utilizing a function such as sigmoid( ) = (exp( ) = (exp( )−1)/(exp( )+1). A final output cos-function value can be obtained by: i) multiplying the hidden node value by a weight between the hidden node and the output end; ii) summing the results of multiplications; and iii) applying the sigmoid function.

Meanwhile, referring to FIG. 8, h_s(j) denotes a (j)th hidden node for obtaining a sin-function value, x_s(i) denotes an input value of the (i)th input end. The outputs from the respective hidden nodes are summed and outputted as a sin-function value through an output end, and w_s_ij(i, j) refers to a weight between the (i)th input end and (j)th hidden node. w_s_jk(j, k) denotes a weight between the (j)th hidden node and the (k)th output end. Sin-function value is obtained in the substantially same way as that of obtaining the cos-function value, and therefore, its description will be omitted. Hereinbelow, the way of obtaining cos-function value will be described mainly with respect to FIG. 7.

A forward process of the neural network refers to a process in which X-axis and Y-axis fluxgate voltage values of the data sheet as shown in FIG. 5 are consecutively inputted to the input end so that outputs can be obtained by applying weights and sigmoid function. The outputs as obtained are compared with the reference values of the data sheet as shown in FIG. 5. If the reference value and the output value exceed a predetermined allowable range, a backward process is performed to correct the weights.

As described above, the training of the neural network is performed by repeating the forward and backward processes using pre-measured input values and output values. The training of the neural network continues until it reaches a predetermined allowable error range, and if so, the weights as obtained are consecutively recorded and stored as a weight matrix. The weights of the weight matrix are the most optimum weights which can calibrate the X-axis and Y-axis fluxgate voltage values to optimum cos-function and sin-function values.

FIG. 9 illustrates in graphical representation the signal processing based on the training as described above. In FIG. 9, a curve 710 represents the actual X-axis fluxgate voltage values calibrated near to optimum values by using the neural network, and a curve 720 represents the optimum cos-function values, that is, optimum reference values. A curve 810 represents the actual Y-axis fluxgate voltage values calibrated near to the optimum values by using the neural network, and a curve 820 represents the optimum sin-function values, that is, optimum reference values.

The weight matrix, obtained from the training, are stored from the PC of a developer to the memory 220 of the fluxgate sensor 220 in operation S940. The training of the neural network is a quite complicated computational process, and therefore, it is difficult to directly execute the process in the control unit 210 of the fluxgate sensor 200. Accordingly, a weight matrix may be made separately, and the control unit 210 can use such prepared matrix.

In order to locate the current position, the user turns on the fluxgate sensor 200, and measures current X-axis and Y-axis fluxgate voltage values in operation S950. The control unit 210 reads weights corresponding to the measured X-axis and Y-axis fluxgate voltages from the memory 220, and the forward processing of the neural network is performed in operation S960. As a result, the X-axis and Y-axis fluxgate voltages are calibrated to optimum cos-function and sin-function values (cos ψ and sin ψ). The values cos ψ and sin ψ are substituted in the following equation for the computation of azimuth angle in operation S970:

$$\psi = \tan^{-1}\left(\frac{\sin\psi}{\cos\psi}\right) \quad \text{[Equation 2]}$$

where ψ denotes an azimuth angle, and cos ψ and sin ψ refer to calibrated X-axis and Y-axis fluxgate output values.

FIG. 10 shows the operations S910 through S940 carried out by the developer of the fluxgate sensor. Referring to FIG. 10, an operator purchases a fluxgate sensor 200 which has the weight matrix stored in the memory, and measures the current azimuth angle by taking the operations S950 through S970. More specifically, the operator turns on the fluxgate sensor 200 and measures the two-axis fluxgate voltage values, and the measured voltage values are calibrated to the stored weight matrix. Therefore, an accurate azimuth angle is obtained.

Even when the fluxgate sensor 200 is slanted, outputs can always be calibrated to optimum values, and therefore, an accurate azimuth angle can be guaranteed.

As described above with a few exemplary embodiments of the present invention, the fluxgate sensor itself can measure accurate azimuth angle even on a slope, without requiring a slope measuring sensor. Because a slope sensor can be omitted, a compact-sized and economical fluxgate sensor which consumes less power, can be provided. Accordingly, the portable fluxgate sensor can be provided. Furthermore, while the conventional slope sensor frequently has an error in the measurement of azimuth angle due to inaccurate recognition of the sloping degree of the fluxgate sensor, according to the present invention, the fluxgate sensor can guarantee accurate azimuth information even in motion, because it needs not measure the sloping degree.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A fluxgate sensor comprising:
   a two-axis fluxgate having an X-axis fluxgate and a Y-axis fluxgate in substantially perpendicular relation with the X-axis fluxgate, the two-axis fluxgate outputting voltage values of the X-axis and Y-axis fluxgates corresponding to a terrestrial magnetism;
   a memory storing therein a neural network weight matrix which corresponds to the X-axis and Y-axis fluxgate voltage values, respectively; and
   a control unit calibrating the X-axis and Y-axis fluxgate voltage values based on the neural network weight matrix stored in the memory, and computing an azimuth angle by using the calibrated voltage values.

2. A fluxgate sensor comprising:
   a two-axis fluxgate having an X-axis fluxgate and a Y-axis fluxgate in substantially perpendicular relation with the X-axis fluxgate, the two-axis fluxgate outputting voltage values of the X-axis and Y-axis fluxgates corresponding to a terrestrial magnetism;
   a memory storing therein a neural network weight matrix which corresponds to the X-axis and Y-axis fluxgate voltage values, respectively; and
   a control unit calibrating the X-axis and Y-axis fluxgate voltage values based on the neural network weight matrix stored in the memory, and computing an azimuth angle by using the calibrated voltage values,
   wherein the X-axis and Y-axis fluxgate voltage values comprise mapping values normalized by the control unit based on:

$$Xf_{norm} = \frac{2Xf - Xf_{max} - Xf_{min}}{(Xf_{max} - Xf_{min})} * \cos\lambda$$

$$Yf_{norm} = \frac{2Yf - Yf_{max} - Yf_{min}}{(Yf_{max} - Yf_{min})} * \cos\lambda$$

where 'Xf' is an actual voltage value of the X-axis fluxgate, 'Yf' is an actual voltage value of the Y-axis fluxgate, '$Xf_{norm}$' and '$Yf_{norm}$' are normalized values of 'Xf' and 'Yf', '$Xf_{max}$' and '$Xf_{min}$' are maximum and minimum values of 'Xf', '$Yf_{max}$' and '$Yf_{min}$' are maximum and minimum values of 'Yf', and λ is a dip angle.

3. The fluxgate sensor according to claim 1, wherein the neural network weight matrix is computed by a training of the neural network, in which a predetermined data sheet is applied to a neural network software,
   the predetermined data sheet recording therein the X-axis and Y-axis fluxgate voltage values corresponding to changes of pitch, roll and yaw angles of the fluxgate sensor.

4. The fluxgate sensor according to claim 3, wherein the predetermined data sheet is made by:
   with the pitch and roll angles of the fluxgate sensor at a certain fixed angle, rotating once the fluxgate sensor to vary the yaw angle by a predetermined degree and measuring and storing the X-axis and Y-axis fluxgate voltage values; and repeating the rotating, measuring and storing while varying one of the pitch and the roll angles.

5. An azimuth angle measuring method of a fluxgate sensor which comprises an X-axis fluxgate and a Y-axis fluxgate, and a memory, the azimuth angle measuring method comprising:

(a) measuring voltage values of the X-axis and the Y-axis fluxgates corresponding to changes of pitch, roll and yaw angles of the fluxgate sensor, normalizing the measured X-axis and Y-axis fluxgate voltage values and accordingly making a predetermined data sheet;

(b) making a neural network weight matrix by training a neural network based on the predetermined data sheet;

(c) storing the neural network weight matrix in the memory; and (d) measuring the normalized voltage values of current x-axis and Y-axis fluxgates of the fluxgate sensor, and computing an azimuth angle by using the neural network weight matrix.

6. An azimuth angle measuring method of a fluxgate sensor which comprises an X-axis fluxgate and a Y-axis fluxgate, and a memory, the azimuth angle measuring method comprising:

(a) measuring voltage values of the X-axis and the Y-axis flux gates corresponding to changes of pitch, roll and yaw angles of the fluxgate sensor, normalizing the measured X-axis and Y-axis fluxgate voltage values and accordingly making a predetermined data sheet;

(b) making a neural network weight matrix by training a neural network based on the predetermined data sheet;

(c) storing the neural network weight matrix in the memory; and (d) measuring the normalized voltage values of current x-axis and Y-axis fluxgates of the fluxgate sensor, and computing an azimuth angle by using the neural network weight matrix, wherein (a) comprises:

(a1) with the pitch and roll angles of the fluxgate sensor fixed at '0' angle, rotating the fluxgate sensor once to vary the yaw angle by a predetermined degree, and measuring and normalizing the voltage values of the X-axis and Y-axis fluxgates;

(a2) measuring and storing a maximum, a minimum and a dip angle of the voltage values of the X-axis and Y-axis fluxgates;

(a3) with the pitch and roll angles of the fluxgate sensor fixed at a predetermined degree, rotating the fluxgate sensor once to vary the yaw angle by a predetermined degree and measuring the voltage values of the X-axis and Y-axis fluxgates;

(a4) computing a cos-function value and a sin-function value of the yaw angle and recognizing the computed values as reference values;

(a5) varying one of the pitch angle and the roll angle of the fluxgate sensor by a predetermined degree and repeating (a3) and (a4); and (a6) measuring, normalizing and storing the X-axis and Y-axis fluxgate voltage values in every change of one of the pitch angle, the roll angle and the yaw angle, thereby making a data sheet.

7. The azimuth angle measuring method according to claim 6, wherein the normalization is performed based on:

$$Xf_{norm} = \frac{2Xf - Xf_{\max} - Xf_{\min}}{(Xf_{\max} - Xf_{\min})} * \cos\lambda$$

$$Yf_{norm} = \frac{2Yf - Yf_{\max} - Yf_{\min}}{(Yf_{\max} - Yf_{\min})} * \cos\lambda$$

where 'Xf' is an actual voltage value of the X-axis fluxgate, 'Yf' is an actual voltage value of the Y-axis fluxgate, '$Xf_{norm}$' and '$Yf_{norm}$'are normalized values of 'Xf' and 'Yf', '$Xf_{max}$'and '$Xf_{min}$' are maximum and minimum values of 'Xf', '$Yf_{max}$' and '$Yf_{min}$' are maximum and minimum values of 'Yf', and $\lambda$ is a dip angle.

8. An azimuth angle measuring method of a fluxgate sensor which comprises an X-axis fluxgate and a Y-axis fluxgate, and a memory, the azimuth angle measuring method comprising:

(a) measuring voltage values of the X-axis and the Y-axis fluxgates corresponding to changes of pitch, roll and yaw angles of the fluxgate sensor, normalizing the measured X-axis and Y-axis fluxgate voltage values and accordingly making a predetermined data sheet;

(b) making a neural network weight matrix by training a neural network based on the predetermined data sheet;

(c) storing the neural network weight matrix in the memory; and (d) measuring the normalized voltage values of current x-axis and Y-axis fluxgates of the fluxgate sensor, and computing an azimuth angle by using the neural network weight matrix, wherein (b) comprises:

(b1) executing a neural network software;

(b2) forward processing of inputting output values of the X-axis and Y-axis fluxgates of the data sheet to the neural network, applying a predetermined weight and outputting as a cos-function value and a sin-function value;

(b3) backward processing of obtaining an error value by comparing the cos-function value and the sin-function value with a corresponding reference value recorded in the data sheet, and if the error value is determined to exceed a predetermined allowable range, correcting the weight so that the cos-function value and the sin-function value can be brought close to the reference value;

(b4) repeating (b2) and (b3) until the error value is within the predetermined allowable range; and (b5) when the error value is within the predetermined allowable range, storing the corresponding weight and thereby making a neural network weight matrix.

9. An azimuth angle measuring method of a fluxgate sensor which comprises an X-axis fluxgate and a Y-axis fluxgate, and a memory, the azimuth angle measuring method comprising:

(a) measuring voltage values of the X-axis and the Y-axis fluxgates corresponding to changes of pitch, roll and yaw angles of the fluxgate sensor, normalizing the measured X-axis and Y-axis fluxgate voltage values and accordingly making a predetermined data sheet;

(b) making a neural network weight matrix by training a neural network based on the predetermined data sheet;

(c) storing the neural network weight matrix in the memory; and (d) measuring the normalized voltage values of current x-axis and Y-axis fluxgates of the fluxgate sensor, and computing an azimuth angle by using the neural network weight matrix, wherein (d) comprises:

(d1) measuring a normalized value of current X-axis and Y-axis fluxgate voltage values;

(d2) computing a cos-function value by applying a corresponding weight of the neural network weight matrix, which is stored in the memory, to an input of the X-axis fluxgate voltage values;

(d3) computing a sin-function value by applying a corresponding weight of the neural network weight matrix, which is stored in the memory, to an input of the Y-axis fluxgate voltage values; and (d4) computing an azimuth angle by using the cos-function value and the sin-function value.

10. The azimuth angle measuring method according to claim 9, wherein (d4) computes the azimuth angle by:

$$\psi = \tan^{-1}(sin\_out/cos\_out)$$

where, $\psi$ is the azimuth angle, sin_out is the sin-function value, and cos_out is the cos-function value.

* * * * *